(12) United States Patent
Nortoft et al.

(10) Patent No.: US 6,773,848 B1
(45) Date of Patent: Aug. 10, 2004

(54) ARRANGEMENT OF ELECTROCHEMICAL CELLS AND CIRCUIT BOARD

(75) Inventors: Uffe Nortoft, Svendborg (DK); Michael Thorby Jorgensen, Odense So (DK); Ole Stig Nissen, Odense C (DK)

(73) Assignee: Danionics A/S, Odense (DK)

( * ) Notice: Subject to any disclaimer, the term of this patent is extended or adjusted under 35 U.S.C. 154(b) by 0 days.

(21) Appl. No.: 09/869,991
(22) PCT Filed: Jan. 7, 2000
(86) PCT No.: PCT/EP00/00133
§ 371 (c)(1),
(2), (4) Date: Sep. 20, 2001
(87) PCT Pub. No.: WO00/41253
PCT Pub. Date: Jul. 13, 2000

(30) Foreign Application Priority Data

Jan. 8, 1999 (GB) .............................................. 9900396

(51) Int. Cl.[7] .......................... H01M 2/30; H01M 10/36
(52) U.S. Cl. ...................... 429/158; 429/127; 429/149; 429/160; 429/162; 361/776
(58) Field of Search ............................... 429/156, 158, 429/162, 149, 160, 127; 361/776

(56) References Cited

U.S. PATENT DOCUMENTS

| 4,313,084 A | 1/1982 | Hosokawa et al. ......... 323/370 |
|---|---|---|
| 5,367,431 A | 11/1994 | Kunishi et al. ............. 361/502 |
| 5,557,495 A | * 9/1996 | Belcher et al. .......... 361/298.2 |
| 5,637,418 A | 6/1997 | Brown et al. ............... 429/127 |

OTHER PUBLICATIONS

Patent Abstracts of Japan, vol. 95, No. 4, May 31, 1995, Publication No. 07022005, Publication Date Jan. 24, 1995 (Abstract is attached).
Patent Abstracts of Japan, vol. 9, No. 169, Jul. 13, 1985, Publication No. 60041756, Publication Date Mar. 5, 1985 (Abstract is attached).
Chemical Abstracts, vol. 98, No. 2, Jan. 30, 1998, Publication No. 09260803, Publication Date Oct. 3, 1997 (Abstract is attached).
Patent Abstracts of Japan, vol. 18, No. 641, Dec. 6, 1994, Publication No. 06251763, Publication Date Sep. 9, 1994 (Abstract is attached).

* cited by examiner

*Primary Examiner*—John S. Maples
(74) *Attorney, Agent, or Firm*—Darby & Darby

(57) ABSTRACT

The application describes a cell unit which includes at least two flat electrochemical cells (1', 1", 1''') and a circuit board (5), the cells being folded onto one or both sides of the circuit board whereby the circuitry on the circuit board is protected. Preferably, the cells and the circuit board have the same lengths and widths. The cells may be provided on two or more edges of the circuit board and optionally two cells are connected at the same edges on the board. A means of connecting electrochemical cells to a circuit board is also described wherein protruding parts (14) of the cell, at the terminal end, are bonded to the circuit board

24 Claims, 11 Drawing Sheets

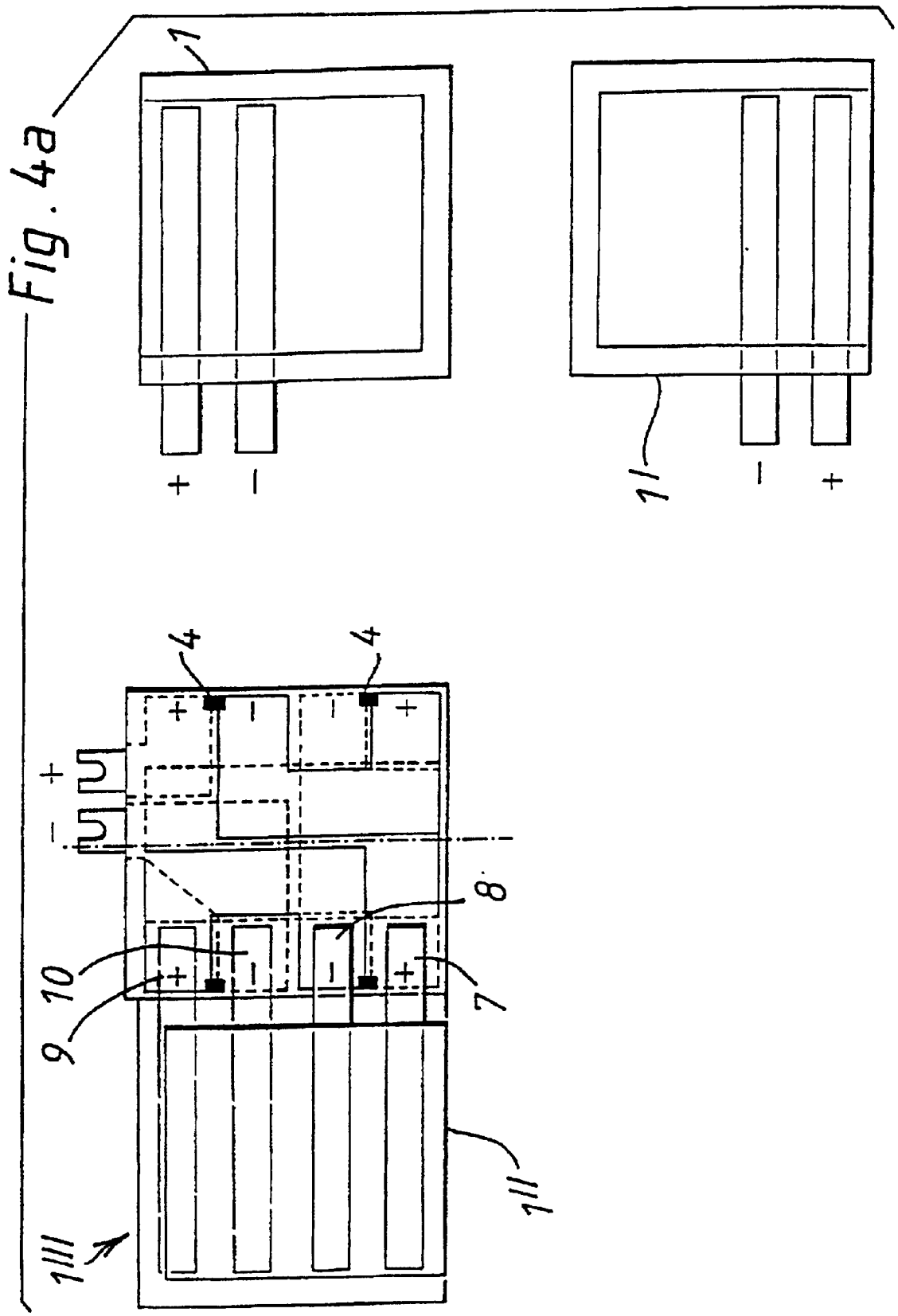

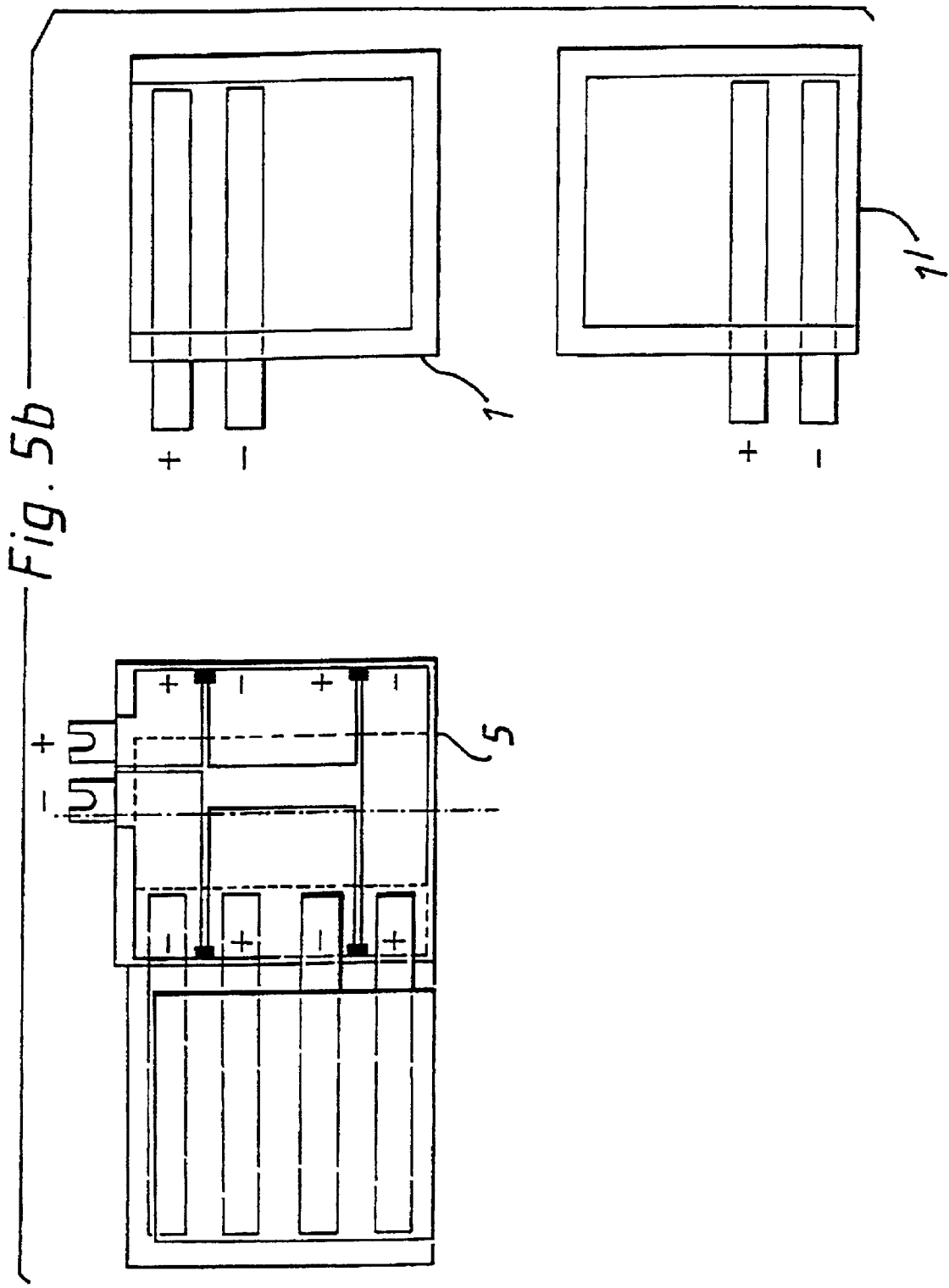

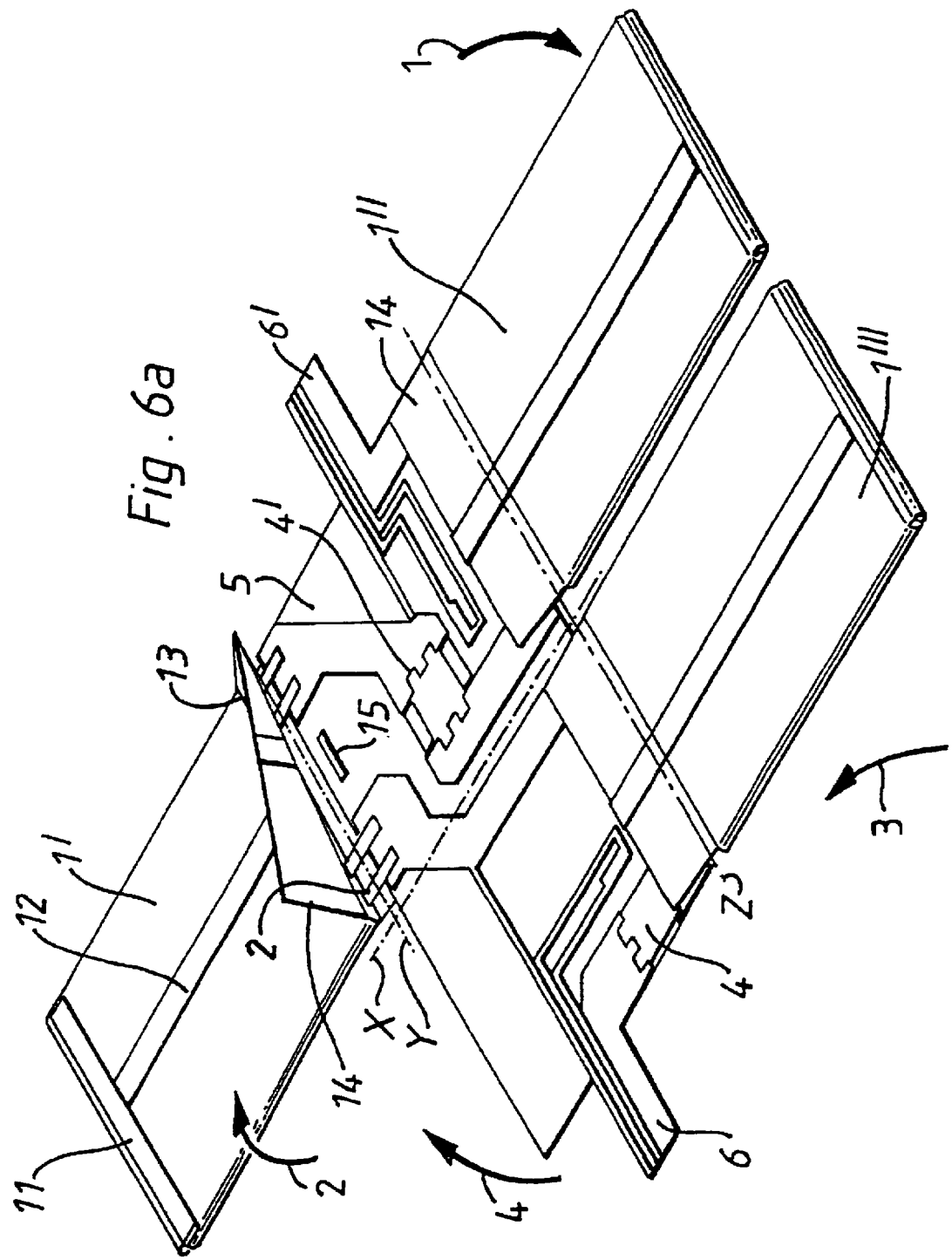

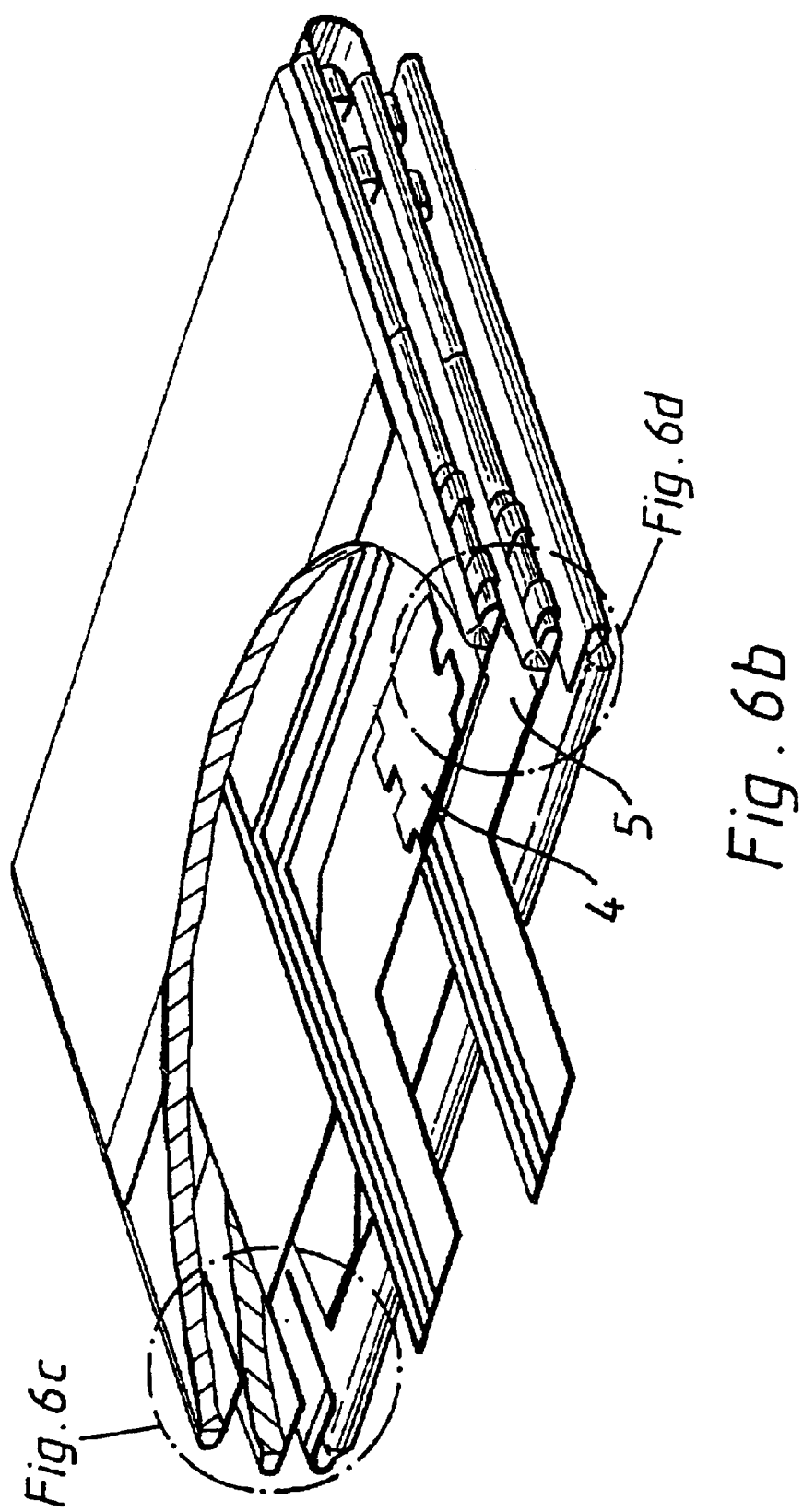

ARRANGEMENT OF ELECTROCHEMICAL CELLS AND CIRCUIT BOARD

The present invention relates to an arrangement of electrochemical cells, in particular an arrangement of batteries or capacitors which are connected in series or in parallel and which include additional electrical circuit elements or additional electrical circuitry.

In recent years there have been large advances in the design and production of batteries. In particular, lithium-ion batteries provide many advantages over conventional nickel cadmium batteries. Lithium-ion batteries can be formed by flattened "jelly-rolls" of interleaved electrodes and electrolyte, the thus formed electrical cell being packaged in a flexible pack formed, for example, from thin laminated foil material. The ability to seal the cells within flexible housings, rather than the traditional rigid cans, is based on the fact that the lithium-ion batteries use a gelled or solid polymer electrolyte. The problems relating to leakage, which are known in connection with conventional batteries, do thus not arise.

The widths and lengths of polymer, lithium-ion cells can be freely selected, as can the thickness of the cells. This flexibility of design, and the flexibility of the finished cell, makes polymer lithium-ion cells particularly suitable for use in portable telephones and computers, as well as in other electronic devices where space is at an absolute premium. It will be well understood that a compromise must often be reached between the energy to be delivered by a battery and the space available for the battery.

Examples of lithium-ion cells construction and the use of flexible packages for such cells are described in more detail in, for example, WO-A-97/03475 (Danionics), EP-A-0845821 (Sanyo) U.S. Pat. No. 5,609,974 (Battery Engineering), U.S. Pat. No. 4,997,732 (MHB), U.S. Pat. No. 5,476,668 (Bell), WO-A-95/13629 (Valence), U.S. Pat. No. 5,591,540 (Motorola), U.S. Pat. No. 5,716,421 (Motorola) and U.S. Pat. No. 5,445,856 (Gill).

The operational voltage of lithium-ion batteries is typically 3 to 4 volts. On the other hand, the voltage demand of many electronic devices is 8 to 9 volts, or some other multiple of the individual cell voltage. Thus, it is commonplace for lithium-ion cells to be arranged one adjacent the other, and connected in series. Alternatively, the cells can be placed one on top of the other, and again connected in series. In different situations, it is possible that a higher capacity is required, for the same voltage, in which case a number of cells could be connected in parallel.

When a number of cells are connected in series, it is generally necessary to provide some voltage equalizing components across each cell, to avoid the problem of the charging voltage being applied unequally between the individual cells, which would result in an unequal load on the individual cells so reducing the performance and lifetime of the cell. The voltage equalizing components are typically resistors. However, it is also commonplace for other electrical components to be connected to the cells, e.g. capacitors, integrated circuits for charge control, state of charge indicators, memory elements, disconnect switches and other associated control circuits. Usually, such additional circuit elements and circuitry are arranged at the end of the stack or row of individual cells, adjacent the terminals. The additional circuit elements and circuitry obviously need some protection and this is usually done by providing a hard box for the arrangement of cells and circuit elements, contacts being provided on the external surface of the hard box.

However, while in such arrangements a saving of space is achieved relative to traditional cells, there is an ever present demand for further space saving so that the maximum energy density can be achieved, particularly for cells to be used in mobile phones etc.

It should be emphasized that the present application, and the issues discussed above, apply equally to electrochemical capacitors as to batteries. The design of such electrochemical capacitors is similar to that of lithium-ion cells. An example of such a capacitor—sometimes known as a "super capacitor"—is described in more detail in U.S. Pat. No. Pat. 5,646,815 (Medtronic) or in EP-A-0625787 (Matsushita). Generally speaking, electrochemical capacitors, either based on the double layer principle or on the pseudo-capacitance principle, differ from batteries in providing high discharge rates over a short length of time, whereas batteries are better suited to providing a power output over a longer period of time. Electrochemical capacitors also tend to be able to be recharged many more times than batteries. In some situations, the capacitors can replace batteries and in other situations they can be used together with batteries, for example as load levelling devices.

The capacitors can also be used as memory back-up elements in electronic devices, and in mobile transmitting equipment, for example in connection with mobile telephones where there is a demand for high current rate pulses. In this context, therefore, a combination of capacitors and high density battery cells is often required.

The operational voltage of a double layer supercapacitor is typically 2 to 3 volts. For the same reasons as discussed above in relation to battery cells, it is frequently necessary to connect a number of electrochemical capacitors together, in series or in parallel. As indicated above, it is also often necessary to connect a combination of battery cells and electrochemical capacitors together. Again, these groups of cells will tend to include electrical components and electronic circuits, which typically would be housed altogether in a hard box, thus providing protection for the circuitry.

Electrochemical cells, either batteries or capacitors, are often produced as relatively thin square or rectangular cells, as described in the above-mentioned U.S. Pat. No. 5,445, 856. In the present application these cells are called "flat cells" and this term is intended to cover cells whose thickness is substantially less than the width and/or length of the cells. Because of the production method of the cells—often by winding strips of electrodes and electrolyte—the cells will be square or rectangular in shape. The term "flat cells" will thus normally be understood to mean relatively thin square or rectangular cells, though the invention is not limited to a square or rectangular shape.

In U.S. Pat. No. 5,637,418, an electrochemical cell stack is described in combination with a flexible circuit board. In the patent, the circuit board is folded around the electrochemical cell stack.

U.S. Pat. No. 5,367,431 describes a thin power supply unit with flat power supply elements bonded onto a flexible circuit board. In one embodiment, power supply elements are arranged on both sides of the circuit board. Electrical connections between the elements and the circuit board are established by means of openings in the cases of the elements.

It is an object of the invention to provide an arrangement of electrochemical cells and associated electrical components and/or electronic circuitry in which the said components/circuitry can be protected and wherein a relatively high saving of space can be achieved.

According to the invention there is provided a cell unit including at least two flat electrochemical cells which are connected with additional electrical components and are connected together, the cells being folded such that the external terminals of the cell unit are exposed but that the additional elements are positioned between the cells. The components may be positioned between the faces of the cells, when folded together, or between the edges of the cells.

In another aspect of the invention, there is provided a cell unit which includes at least two flat electrochemical cells and a circuit board, the cells being folded onto one or both sides of the circuit board whereby the circuitry on the circuit board is protected. If the circuitry is provided on only one side of the circuit board then the cells can be folded only onto that one side. If circuitry is provided on both sides of the circuit board then preferably the cells are folded onto both sides of the board.

Preferably, the cells and the circuit board are square or rectangular. Cells can be provided on two or more sides of the circuit board and two cells can be connected at each side of the board.

It will be understood that the flat cells which are housed in relatively soft flexible packaging provide a high degree of protection to the circuit elements or circuitry, particularly bearing in mind that the relative flexibility of the cells means that any shocks transferred to the cell unit are at least partly absorbed and are not fully transferred to the circuit elements or circuitry on the circuit board.

Preferred embodiments of the present invention are described in more detail below, by example only, and with reference to the accompanying drawings wherein:

FIG. 4a is an exploded view of an arrangement of electrochemical cells according to a fourth embodiment of the invention.

FIGS. 4b, 4c and 4d are detail views illustrating the connections of the arrangement of the cells of FIG. 4a.

FIG. 5b is an exploded view of an arrangement of electrochemical cells according to the fifth embodiment of the invention.

FIG. 5c is a detail view illustrating the connections of the arrangement of the cells of FIG. 5a.

FIG. 6a is a schematic perspective view of a sixth embodiment of the invention.

FIG. 6b is a perspective view of the arrangement of FIG. 6a, in a folded condition.

Figure 1A:
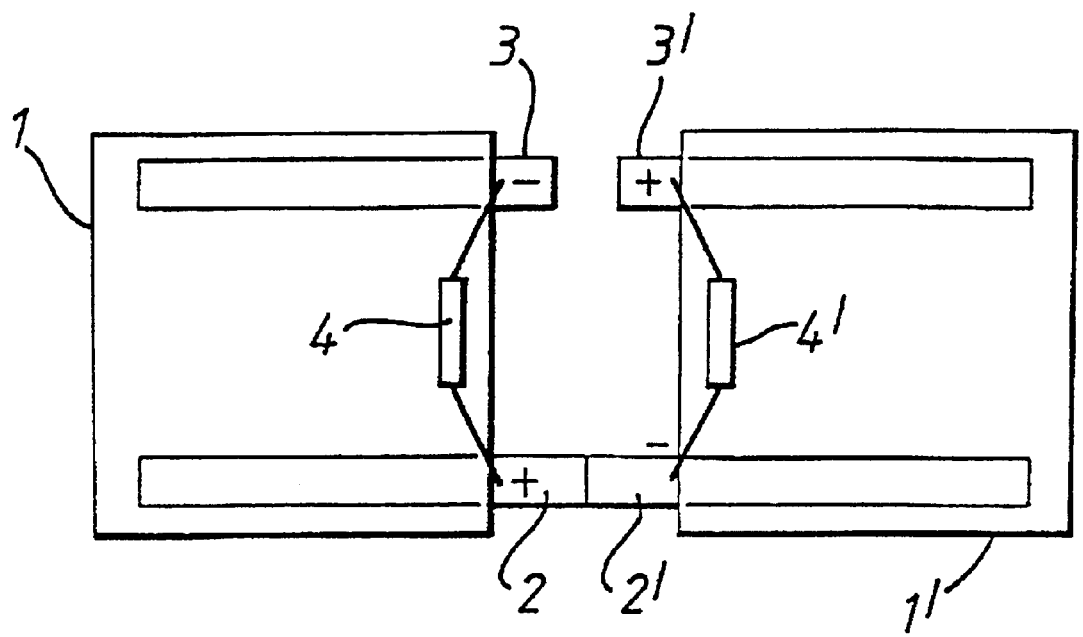
FIG. 1a illustrates at an arrangement of electrochemical cells according to a first embodiment of the invention.

FIG. 1 shows a pair of flat electrochemical cells 1, 1' connected in series. The cells, which may be lithium-ion batteries or capacitors, are flat cells housed in flexible packages. The exact design structure of the cells is not relevant to the present application, but they may be as described in U.S. Pat. No. 5,445,856, i.e. flat wound cells housed in a thin foil laminate package.

The cells 1, 1' are identical, but cell 1' is the other way up to cell 1 so that when the two cells are placed next to each other with the symmetrically arranged terminals in contact, the positive terminal 2 of cell 1 will be in contact with the negative terminal 2' of cell 1'. In other words, the cells are connected in series. The other terminals 3, 3' of the cells provide the external connection points for the cell pair.

Connected across the terminals of each cell are electrical components 4, 4'. The components 4, 4' are, for example, resistors to provide for voltage equalizing between the cells, in a known and conventional manner. The electrical components 4, 4' can be flat or cylindrical, with a minimum thickness, and lie on the surface of the cells 1, 1'. For example, the electrical components may be formed of standard resistors, e.g. metal film resistors.

When the cells 1, 1' are folded together, the electrical components 4, 4' are arranged between the cells, preferably offset relative to one another. Thus, the components do not protrude from the cell pair and are protected between the cells. It will be understood that the thickness of the components between the cells is small (for example 0.5–2 mm) and so the overall thickness of the cell pair will not be increased to any significant extent.

The terminals 2, 2' are folded against the side of the cells 1, 1' when the cell pair is folded. Thus, the only parts protruding from the cell pair are the external terminals 3, 3'. The fact that the electrical components do not protrude from the cell pair, and are arranged within the envelope of the cell perimeters, means that a real saving in space has been achieved. Furthermore, the fact that the electrical components are protected between the cells means that the cell pair does not automatically require a hard box for the protection of the electrical components. This possibility of avoiding the use of a hard box again provides for a real potential space saving.

Figure 1B:
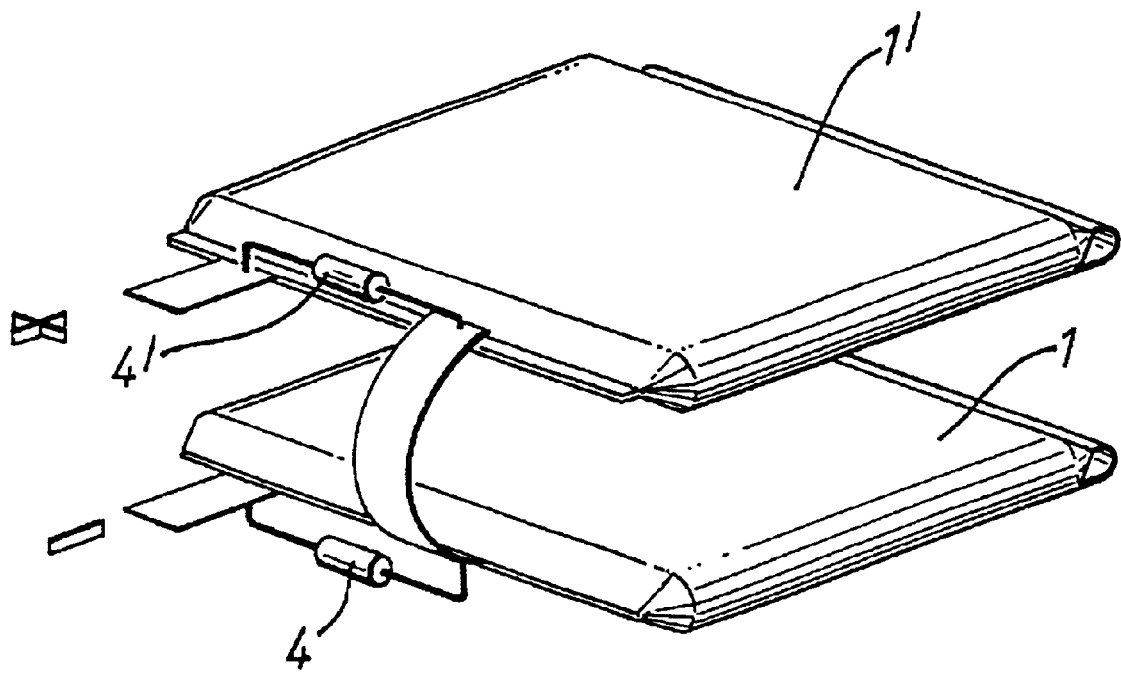
FIG. 1b is a schematic perspective view of the arrangement of FIG. 1a, in a folded condition.

A variation on the above concept is shown schematically in FIG. 1b. Instead of the components being located between the faces of the cells, in FIG. 1b the components are located at the end of the cells, between the terminals. Flat cells of the type described here do not have "square" ends but rather the terminal ends where the packaging material is sealed are tapered or rounded, creating a recess between adjacent folded cells into which the electrical components can be positioned. Again, the components do not protrude from the cell perimeter and are at least partly protected by the packaging material of the cells. Furthermore, the space taken up by the cell pair is not increased to any significant degree.

It will be appreciated by those skilled in the art that the connection of the cell terminals and the electrical components can be easily achieved in an automatic or semi-automatic manufacturing line, by welding or soldering. The terminals are of thin flexible metal foil, as can be the connections for the electrical components themselves.

Figure 2A:
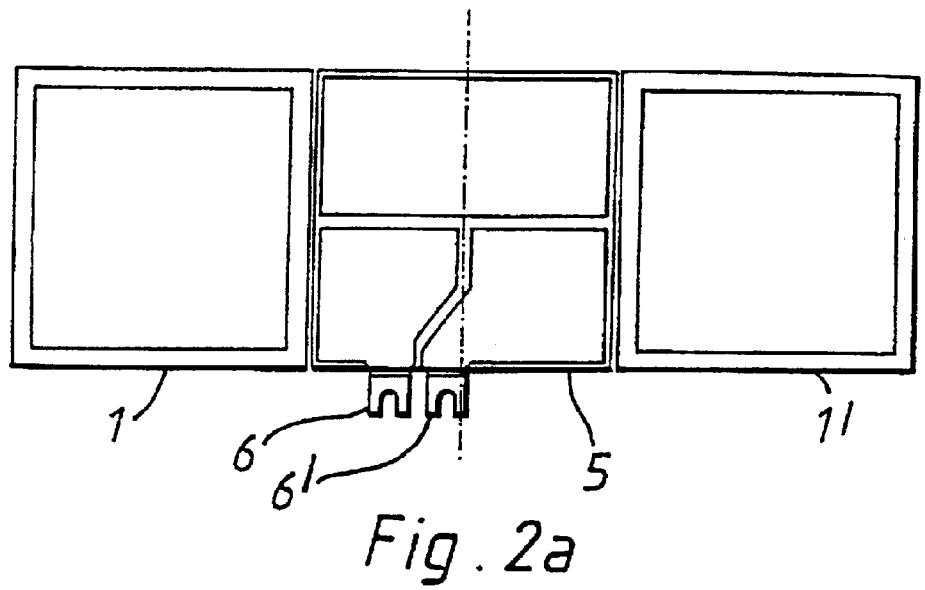
FIG. 2a shows an arrangement of electrochemical cells according to a second embodiment of the present invention.

The embodiment of FIG. 2a is similar to the embodiment of FIG. 1a in that there is a pair of electrochemical cells 1, 1'. However, in this embodiment, there is also provided a circuit board 5 between the cells. The circuit board has six terminals, two terminals 2, 3 facing cell 1, two terminals 2', 3' facing cell 1' and two terminals 6, 6' along a third side for the external connection of the cell arrangement. The circuit board S includes the resistors 4, 4' in a conventional fashion.

The circuit board is fabricated in a known manner. For example, the circuit board can be a flexible circuit board, e.g.

a so-called "flex print circuit board", where the circuit is printed onto a flexible isolating substrate, and then preferably coated by a similar substrate. Specifically, the circuit board could be formed by etching a copper-clad flexible board having a conductor of copper and a base film of polyamide.

The electrical connection tabs on the circuit board are arranged on the edge of the board, so that they correspond in position to the tabs of the electrochemical cells and can easily be connected thereto, without risk of damage to the sensitive battery or circuit components.

As will be apparent from FIG. 2a, the circuit board is of the same shape as the cells 1, 1'. The circuit board will also be formed with a minimum thickness. The fact that the resistors 4, 4' are integrated with the circuit board makes the welding or soldering of the cells 1, 1' easier. The arrangement of three adjacent and similarly shaped parts (1, 1' and 5) makes an automated connecting process relative easy to apply. Thus, the terminals of cells 1, 1' are connected to the circuit board 5 in a corresponding manner to that described in relation to FIG. 1a.

An advantage of the embodiment of FIG. 2a is that after welding/soldering, the terminals of the cells are fixed relative to each other, so that handling of the cell unit is easy with a low risk of damage to the connection points, for example through twisting. Moreover, the embodiment of FIG. 2a has the advantage that the terminals for the external connection can be freely placed, anywhere on the circuit board 5. This freedom of design of the external connection points means that the cell unit can be designed to fit with the electrical device in which it is to be used, rather than the intended electrical device being designed around the cell.

Figure 2B:
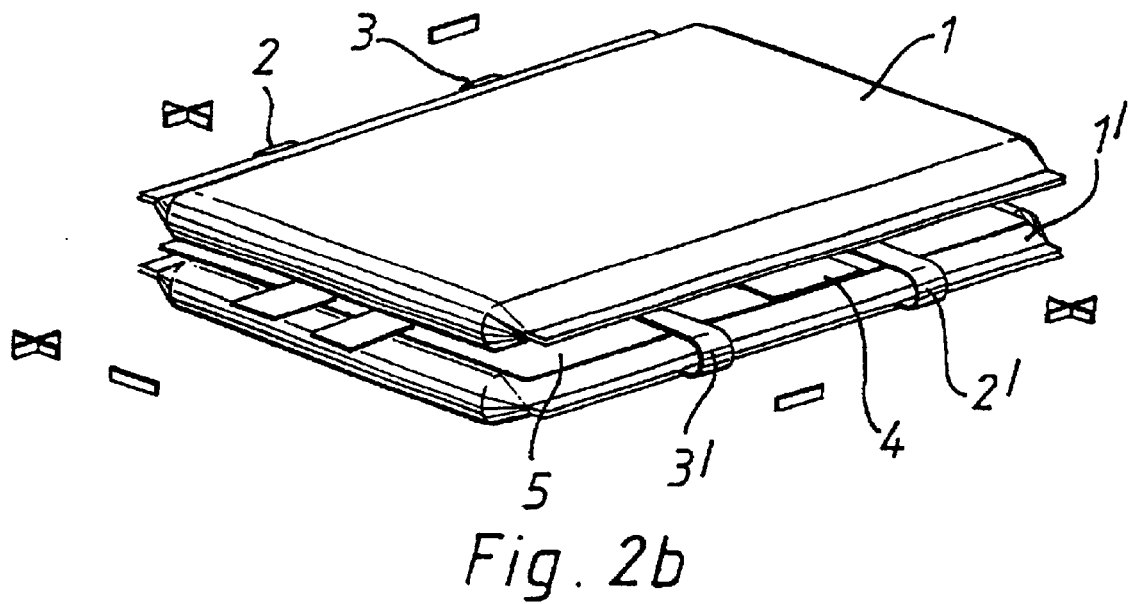
FIG. 2b is a schematic perspective and partly sectional view of the arrangement of FIG. 2a, in a folded condition.

As shown in FIG. 2b, the cells 1, 1' can be folded relative to the circuit board 5, so that the circuit board 5 is sandwiched in between the cells. In this way, the circuitry on the circuit board is completely protected between the cells. In an alternative arrangement, not illustrated, both cells could be folded on top of the circuit board; again, the circuitry of the board would be protected, though the board itself would have to have a degree of rigidity because its rear surface would be exposed.

Needless to say, the length of metal foil connections between the cells and the circuit board is selected so as to permit the folding of the cells in their chosen position.

The components on the circuit board 5 are generally conventional. For example, they may be so-called thick film chip resistors, having a thickness of approximately 0.5 mm. The board could include any electrical circuit, for example a charging circuit, or any components relevant in connection with battery and capacitor technology.

A specific example of a suitable component is a temperature sensitive element. It is known to monitor the temperature of electrochemical cells with such elements, in order to ensure that over-heating does not occur and/or to ensure that the charging or re-charging of the cell is regulated appropriately. If over-heating does occur, a switch on the charger can be tripped.

A typical temperature sensor is a resistor with a positive temperature coefficient, a so-called "PTC element". The location of such a temperature sensor on the circuit board has the advantage that the sensor is immediately adjacent the cell so that a good thermal contact is achieved. Where the cells are folded on both sides of the board, a very efficient temperature monitoring is achieved as one sensor can monitor both cells. Furthermore, no additional wiring of the sensor to the circuit board is necessary.

The size and shape of the circuit board can be freely selected, in accordance with the size and shape of the cells. For example, the circuit board could if desired be twice as long as each cell, so that each cell folded on to half of the circuit board. Again, the circuitry on the board would be protected by the folded cells.

A thin and flexible circuit base or board could also be formed of metal—in particular copper—foils separated and supported by insulating tape or thin plastic foils. On this base the electrical components can be fixed and connected.

Figure 3A:
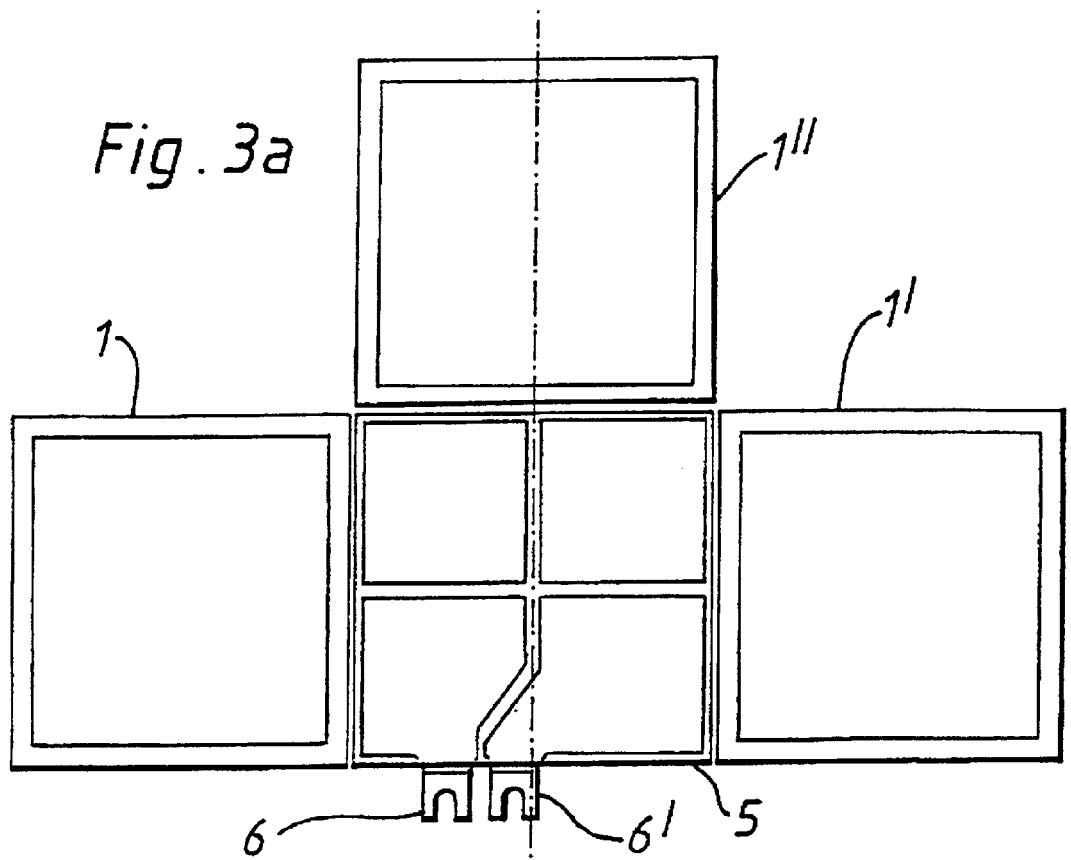
FIG. 3a shows an arrangement of electrochemical cells according to a third embodiment of the present invention.

The embodiment of FIG. 3a is similar to the embodiment of FIG. 2a, in that a circuit board 5 is included. However, in this embodiment there is an additional cell 1", so that a cell is provided on each of three sides of the circuit board, the three cells being in series. As in the embodiment of FIG. 2a, the circuit board includes appropriate electrical components or circuitry, for example resistors, and the cells are welded or soldered to the circuit board by means of flat, bendable terminals. The external terminals 6,6' of the cell unit are provided on the fourth side of the circuit board.

Figure 3B:
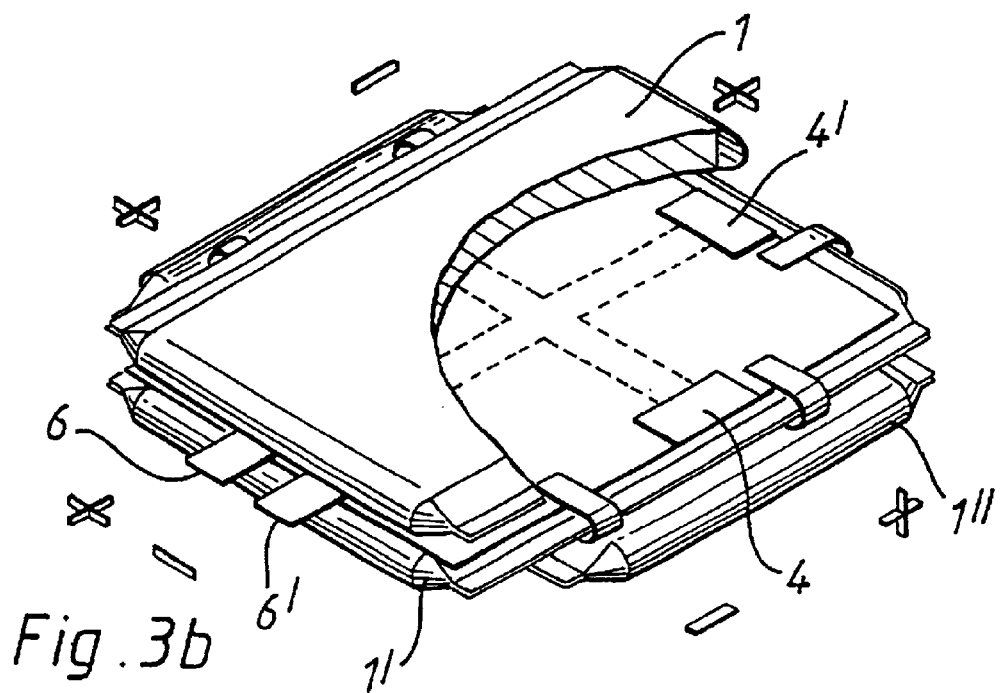
FIG. 3b is a schematic perspective and partly sectional view of the arrangement of FIG. 3a, in a folded condition.

In an arrangement where there are three cells on three sides of the circuit board, obviously a square shape of the circuit board is most convenient. The cells are folded so that preferably two are on top of the circuit board and the third cell folded beneath the board. The circuit board is thus concealed and protected between the cells. This is schematically illustrated in FIG. 3b.

It can be mentioned here that an embodiment with three cells will find many practical applications, given that the voltage of each cell will typically be approximately 2 to 3 volts for capacitor cells and 3 to 4 volts for lithium-ion battery cells and the voltage demand of many electrical devices is approximately 6 to 9 volts.

It should also be mentioned that a fourth cell could be provided at the fourth edge of the circuit board 5. The external terminals can still be arranged on that edge, as these will be accessible when the fourth cell is folded onto the board. Alternatively, the external terminals could be formed as wires, leading out from a corner of the cell unit. In another possibility, all of the cells—two, three or four cells—could be folded onto either the top or bottom of the circuit board and the terminals could be provided on the other surface of the board.

It should be emphasized that the connections illustrated in the FIGS. 2 and 3 are not limiting. Another possibility for connecting more cells is to place cells with terminals on top of each other, connect the flexible terminals and then fold the cells against the board.

Figure 4D:
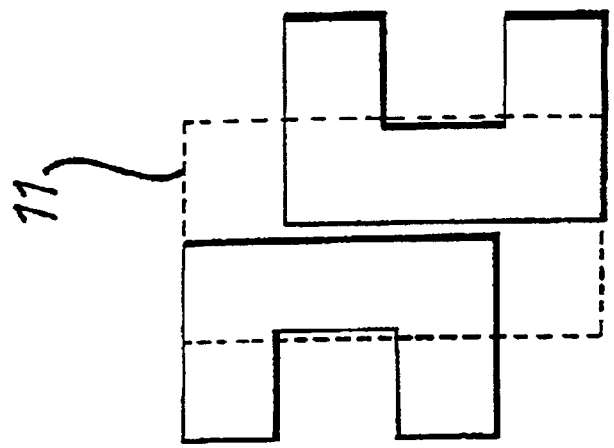

In the embodiments of FIGS. 2 and 3, the circuit board is one-sided. Providing a two-sided circuit board, as illustrated in relation to the embodiment of FIG. 4a, provides even greater design flexibility. In particular, as illustrated in FIGS. 4a to 4e, four cells can be connected to the circuit boards, two cells on each of two opposing edges, leaving the external terminals 6, 6' to be provided along one of the other edges of the circuit board.

The exploded view of FIG. 4a shows unconnected cells 1, 1' with the terminals arranged to one side. The cells 1, 1' are different ways up so that the terminals of cell 1 are provided to one side and the terminals of cell 1' are provided to the other side. The cells 1, 1' can thus be placed one on top of each other, to the right side of the circuit board 5, with their terminals not overlapping but instead connecting to the appropriate circuit paths on the board as illustrated.

On the left hand side of FIG. 4a, a pair of cells 1", 1'" is shown, connected to the board, the lower terminals 7, 8 being of the upper cell 1" and the upper terminals 9, 10 being of the cell 1'" beneath.

Figure 4C:
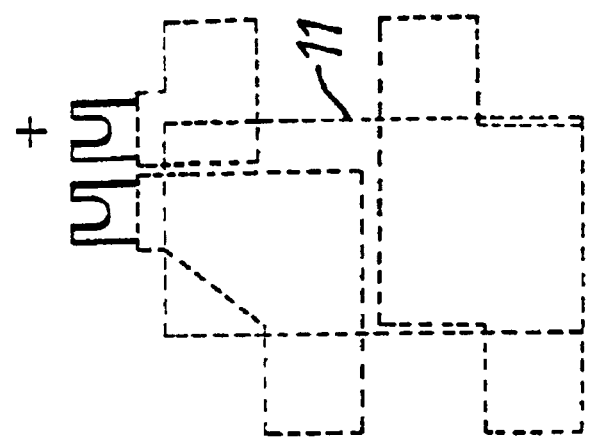
Figure 4B:
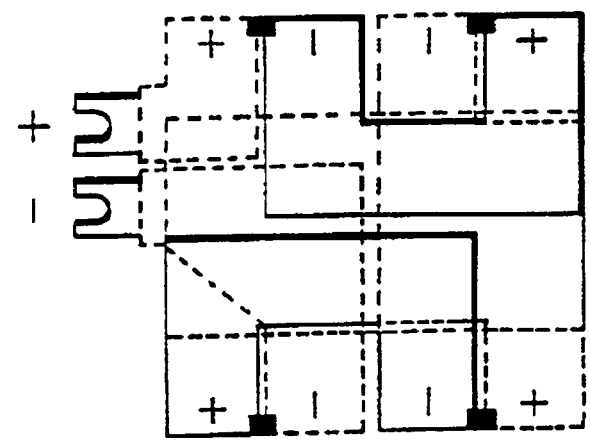

FIG. 4b shows in more detail the circuit board of FIG. 4a. The resistors 4 provided between the terminal connections for each cell are shown. In an alternative embodiment, the resistors could be temperature sensing elements as described above. It will be well understood that the four cells are connected in series, with the negative terminal of cell 1' being connected to the positive terminal of cell 1", the negative terminal of cell 1" being connected to the positive terminal of cell 1''' etc.

In FIG. 4c are shown the circuit paths on the circuit board 5 for the external connection of the series of cells, together with the connection of cell 1' to cell 1". FIG. 4d shows the connection of cell 1 to cell 1' as well as the connection of cell 1" to cell 1'''. The dashed rectangular panel in FIGS. 4b, 4c and 4d represents an insulating sheet 11 to separate the circuitry of FIG. 4c from the circuitry of FIG. 4d.

The completed cell package is formed by folding the two cells on one side of the circuit board 5 on top of that board and folding the two cells on the opposite side below the circuit board. This arrangement is illustrated schematically in FIG. 4e. Alternatively, a cell from each side would be folded on top and beneath the board.

Figure 4E:
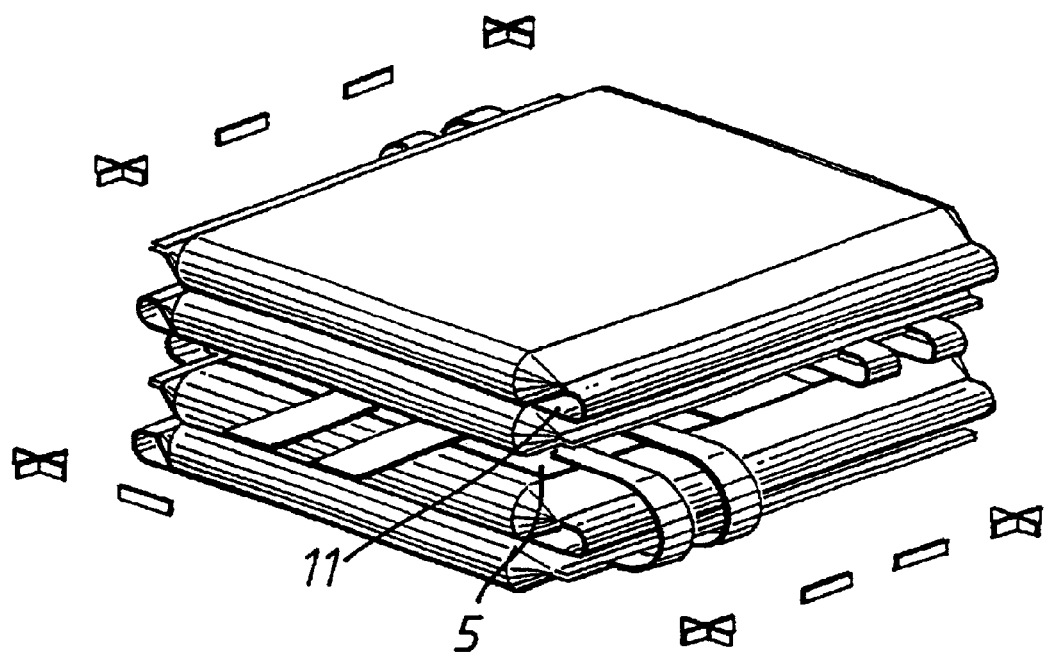
FIG. 4e is a schematic perspective and partly sectional view of the arrangement of FIG. 4a, in a folded condition.

An additional advantageous feature is illustrated in FIG. 4e. The sealed edges 11 or "fins" of the flat cells are folded onto that surface of the cells which, when the cells are folded onto the circuit board, will be abutting the board. In this way, the foot-print of the cell package is reduced, in that the edges are folded inwards, and furthermore the folded in edges provide a slight spacing of the cells from the board. This spacing provides a convenient accommodation of the components on the board and of the connecting tabs, and also a greater degree of protection to these components and tabs, as the pressure thereon is reduced.

In the embodiment of FIG. 4a, it will be appreciated that each of the cells is of the same design. In contrast, in the embodiment of FIG. 5a, the cell of each pair on each opposing side of the circuit board 5 is different from the other cell of the pair, as will be appreciated from a consideration of the exploded view of FIG. 5b. The terminals of the cell 1' shown in FIG. 5b are reversed as compared to the terminals of the cell 1. This reversal of the positive and negative terminals of one of the cells provides for simpler series interconnection of the cells, as shown in particular in FIG. 5c, which illustrates the circuit board 5 of FIG. 5a. Thus, the crossing of the connections which occurs in relation to the circuit board of FIG. 4 is avoided, since the negative and positive terminals of the cell pairs 1 and 1', and 1" and 1''' are adjacent. This simpler interconnection of the cells provides the immediate advantage that a one-sided circuit board can be used.

Figure 5D:
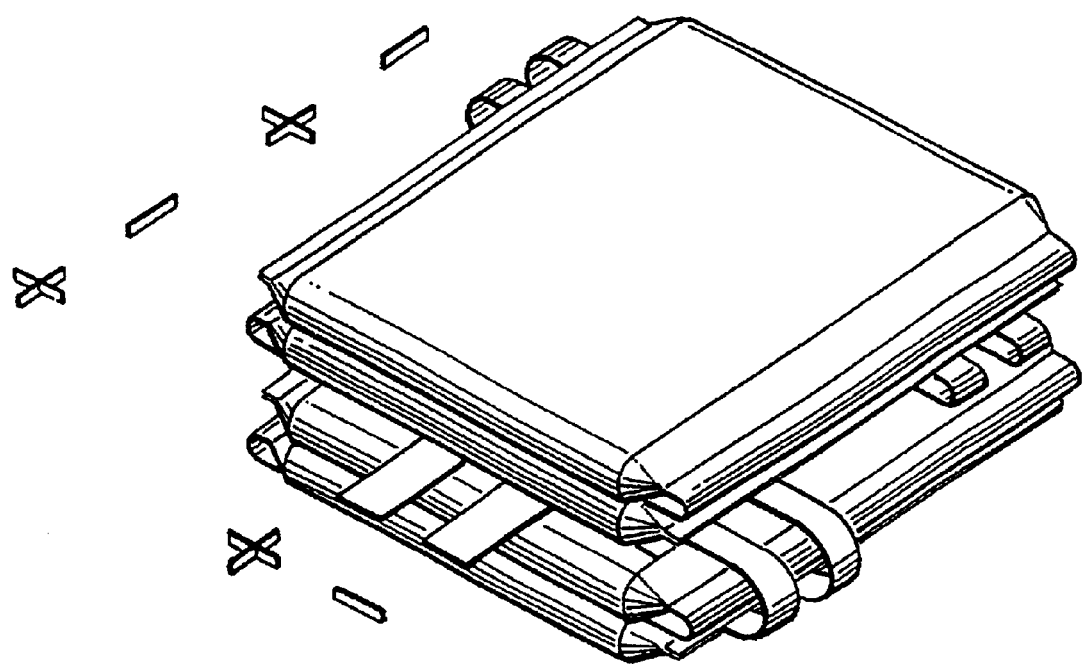
FIG. 5d is a schematic perspective and partly sectional view of the arrangement of FIG. 5a, in a folded condition.
Figure 5A:
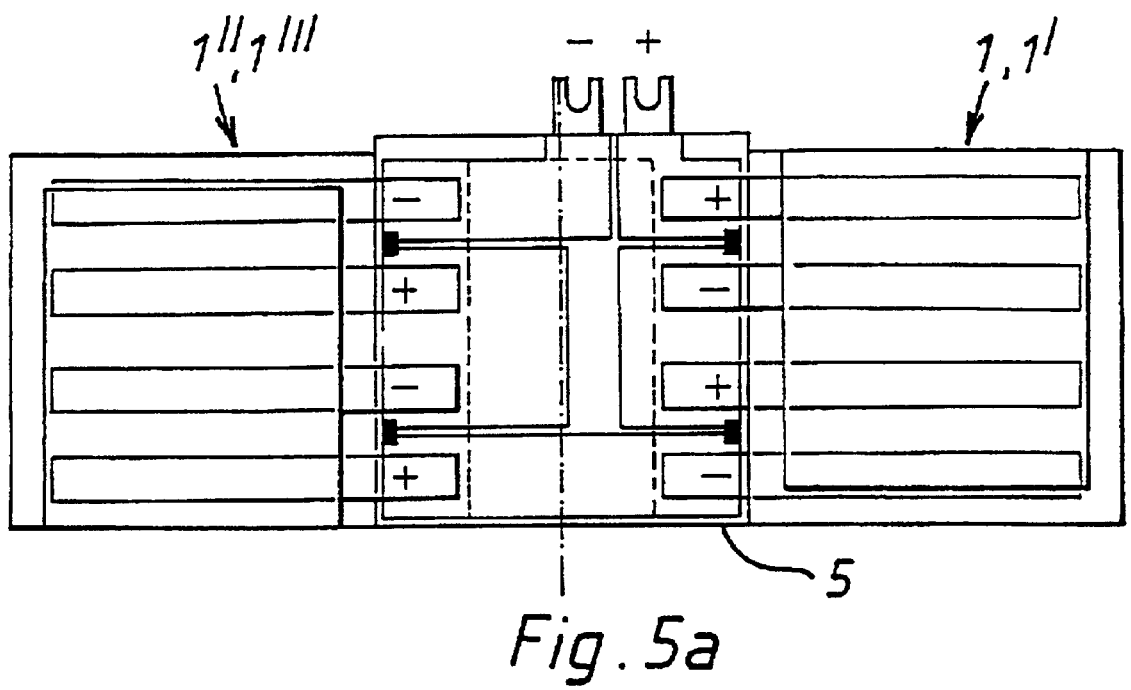
FIG. 5a illustrates at an arrangement of electrochemical cells according to a fifth embodiment of the invention.
Figure 5C:
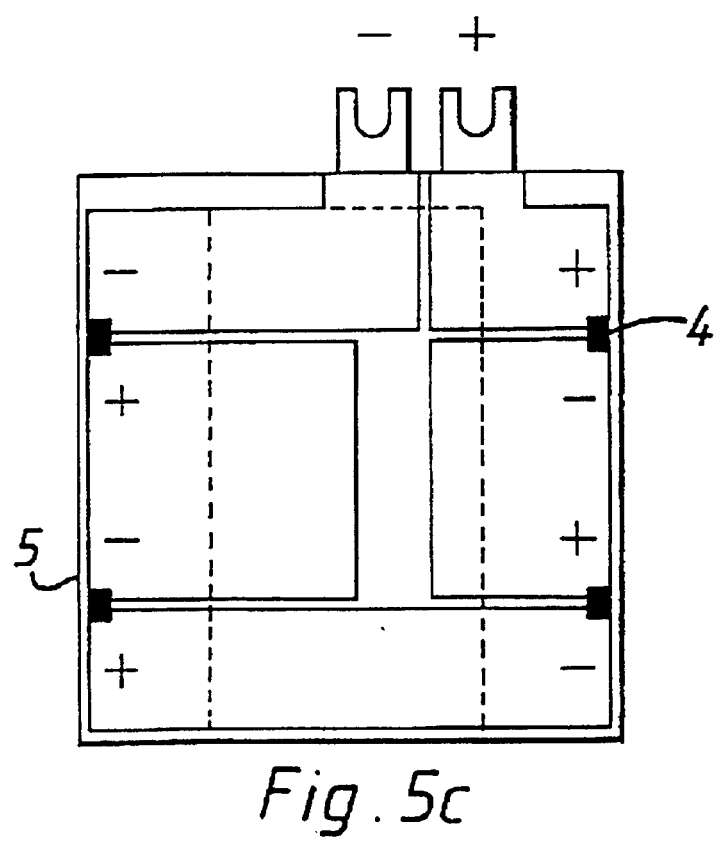

FIG. 5c also shows the resistors 4 between the terminals of each cell. In an alternative embodiment, the resistors could be temperature sensing elements as described above.

As in the embodiment of FIG. 4, the cells can be folded on either side of the circuit board, preferably two on top and two below as shown in FIG. 5d.

The sixth embodiment of the invention which is illustrated in FIGS. 6a, 6b, 6c and 6d has some similarities with the embodiment of FIG. 3 in that there are three electrochemical cells which are folded relative to the circuit board. However, whereas in the embodiment of FIG. 3 the three cells are arranged on three sides of a substantially square circuit board, in the embodiment of FIG. 6 the circuit board is rectangular. The width of the rectangular circuit board is approximately the length of one of the electrochemical cells and the length of the circuit board is approximately twice the width of the electrochemical cells (which may be either square or rectangular).

A rectangular circuit board as illustrated in FIG. 6a could have, instead of three or fewer cells, four or more electrochemical cells connected thereto, with sets of cells folded next to each other so that the resulting arrangement remains rectangular, matching the shape of the circuit board. However, the embodiment of FIG. 6 is a further modification of a basic rectangular circuit board because the circuit board is itself intended fold in half.

The circuit board is indicated in FIG. 6 by the reference numeral 5. There are three cells 1', 1" and 1'''. The circuit board includes components 4, 4', for example temperature sensing elements. Terminals 6, 6' are for external connection of the sealed arrangement, after folding. The terminals 2, 2' of cell 1' are seen connected to the circuit board, in a conventional fashion, and it will be understood that the terminals of the other cells are connected in the same way.

As discussed above, the circuit can include temperature sensing elements in the form of resistors with positive or negative temperature coefficients, i.e. PTC or NTC elements. Alternatively, the board can include other components, in particular for control and safety purposes in relation to the charge and discharge of the cell arrangement.

Each electrochemical cell is of the same size and is formed in the same way, with a wound cell precursor sealed within a flexible package. In this embodiment, the sheet material forming the flexible package is folded around the wound cell precursor so as to form a seal 11 at the bottom end, a seal 12 along one flat side of the cell and a seal 13 at the top end, where the cell terminals 2, 2' or tabs emerge. The seals are closed in a conventional fashion, using heat sealing. Each cell package is thus similar to that described and illustrated in the aforementioned EP-A-0845821 (see FIG. 17 in particular).

As discussed above in relation to FIG. 4e, the end seal 11 can be folded back on top of the sealed package in such a direction that, when the cell 1' is folded under the circuit board 5, the folded sealed edge 11 creates a slight spacing from the circuit board 5. This folded edge is seen most clearly in FIG. 6a in relation to cell 1'. Furthermore, the longitudinal seal 12, on the flat side of the cell 1', also creates a slight spacing from the circuit board 5.

At the terminal end of each cell, it is very advantageous if the material of the cell package extends beyond the seal 13 enclosing the cell terminals and is then cut along each side to provide two flaps 14. When the cell terminals 2, 2' are connected to the circuit board 5, one flap 14 will be above the circuit board 5 and the other will be below. By mechanically connecting these flaps 14 to the circuit board, a strong connection between the cell and the circuit board is achieved, so that any loads or bending stresses caused by folding of the cells will be taken by the sealing material, rather than by the cell terminals. This greatly reduces the possibility of the electrical connections between the cells and the circuit board being damaged in the folding operation. The flaps can, for example, be connected to the circuit board by gluing or taping.

In a less preferred variation of this, the flaps 14 do not need to be fixed to the circuit board but merely cover the cell terminals. The flaps still provide a measure of protection to the electrical connection between the cells and the circuit board and in particular still protect the terminals from possible short circuits.

It will be understood that in the process of welding the terminals of the cells to the circuit board, the flaps can easily be folded back, out of the way of the welding operation, and then folded onto the circuit board, when the welding operation is completed.

A most preferred method for joining the flaps 14 of the electrochemical cells to the circuit board involves the use of a circuit board with one or more apertures or perforations. One such aperture is illustrated in FIG. 6a and indicated by reference numeral 15. The aperture or apertures is or are arranged at each side of the circuit board where the cell is to be connected and is/are positioned such that it/they will be covered by the flaps 14 at the terminal end of the cell package. The aperture 15 shown in FIG. 6a is elongate, in particular rectangular. However, a row of smaller apertures or perforations would work equally well. The material from which the cell packages are made is typically a flexible sealing laminate which comprises an inner sealing layer which allows the laminate material to be glued or sealed onto itself, in particular by heat sealing. The flaps 14 will of course be made of the same material and can contact each other through the aperture(s) 15 of the circuit board 5. Accordingly, after the cell terminals are joined to the circuit board, the flaps of the cells can very easily be joined to the circuit board by sealing the material of the flaps together, through the aperture(s). This joining of the two flaps can be achieved by gluing or heat sealing. This creates a strong and stable connection between each cell and the circuit board and ensures that any loads or forces created by the folding operation are largely taken by the material of the cell package, rather than the terminals.

The preferred means of joining the flaps of the cell packages together, through the apertures or perforations of the circuit board, is by means of heat sealing which is an operation very suitable for automatic production.

The fixing of the cells to the circuit board in this way creates a reliable connection which ensures that the cell package keeps its desired shape, especially during the folding operation (to be described below). In addition to providing a physical protection to the cell terminals, the flaps of sealing material also protect against electrical short circuits.

As already mentioned, the circuit board is designed so that it can fold in half. The fold line is indicated by the letter X in FIG. 6a. Reference numerals Y and Z indicate the fold lines between the edges of the circuit board and the cells. It will be understood that the cells and circuit board can be folded together in a variety of different orders. One preferred order is indicated by the numbered arrows in FIG. 6a, so that in the first step the cell 1" is folded about line Z underneath the circuit board, in the next step the cell 1' is folded about line Y on top of the circuit board, in the third step the cell 1'" is folded about line Z on top of the circuit board and in the fourth step the circuit board is folded about line X.

The resulting folded arrangement is such that cell 1" is on the bottom and cells 1' and 1'" are between the two folded halfs of the circuit board. It will be noted in particular that the circuit board terminals 6, 6' will be positioned next to each other, as a result of the folding operation. Also, the temperature sensing elements 4, 4' will be arranged between and/or on top of the folded cells.

In an alternative folding operation, in the third step the cell 1'" can instead be folded underneath the circuit board (before the circuit board is folded). With this arrangement, after the circuit board is folded, the cell 1'" is on top of the folded of the folded cell arrangement and the cell 1" is at the bottom.

Figure 6C:
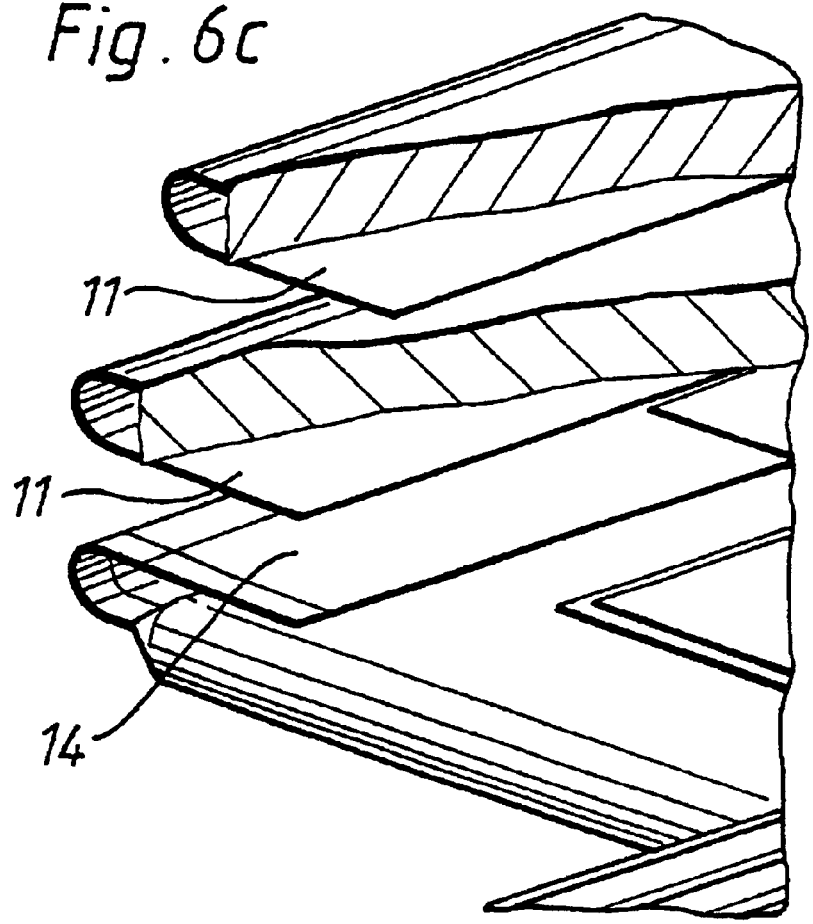
FIGS. 6c and 6d are enlarged details of the perspective view of FIG. 6b.
Figure 6D:
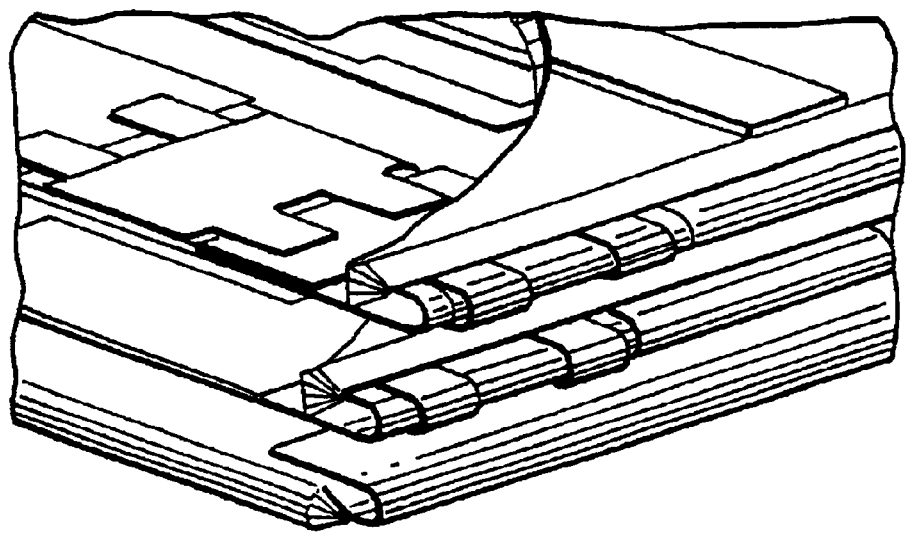

This particular arrangement is illustrated in the partly cut away sectional view of FIG. 6b. This view, together with the enlarged detailed views of FIGS. 6c and 6d, show in particular the positioning of the heat sensing elements 4, 4" and the circuit board terminals 6, 6'. Furthermore, in FIG. 6c the folding of the ends seals 11 of the cell packages, are clearly illustrated, these folded ends seals 11 providing a slight spacing for the circuitry of the circuit board 5.

It should be noted that the connection of a cell to a circuit board, using the flaps of sealing material at the terminal end of the cell, with or without apertures or perforations in the circuit board, is a novel approach in cell technology. The circuit connection method is considered herein as a separate aspect of the invention and is claimed accordingly. This connection method is relevant for both multiple cell connections to a circuit board and also the connection of a single cell to a circuit board.

While FIGS. 4b, 5c and 6a show examples of interconnecting circuitry on the circuit board 5, other connection schemes are possible and additional components can easily be including in the printed circuit board using conventional technology. The purpose of the figures is to illustrate the concept behind the present invention, not to illustrate details of circuit board design technology. It should also be emphasized that all of the cells need not be of the same size. Furthermore, combinations of serial and parallel connections can be provided on the circuit boards. As previously mentioned, combinations of batteries and capacitor cells can be used.

The size of the circuit board is obviously largely dictated by the size of the cells, which are typically from 12 to 25 mm wide and 17 to 50 mm long. The cell thickness is for example between 1 and 5 mm and the circuit board thickness may also be in this range, though obviously a minimum thickness is desirable, e.g. 0.5 to 2 mm.

The advantages of the invention will be apparent from the above description. However, the invention is not limited to the details of the above examples of the invention.

What is claimed is:

1. A cell unit comprising at least two flat electrochemical cells joined by flexible connections to at least one edge of a circuit board, the cells being moveable from a first position laterally of the circuit board to a second position arranged against one or both sides of the circuit board, whereby the circuitry on the circuit board is protected.

2. A cell unit according to claim 1, wherein the cells and the circuit board have the same lengths and widths.

3. A cell unit according to claim 1, wherein circuitry is provided on only one side of the circuit board and the cells are arranged against that one side or on both sides.

4. A cell unit according to claim 1, wherein circuitry is provided on both sides of the circuit board and the cells are arranged against both sides of the board.

5. A cell unit according to claim 1, wherein the cells and the circuit board are square or rectangular.

6. A cell unit according to claim 1, wherein cells are provided on two or more edges of the circuit board.

7. A cell unit according to claim 1, wherein the circuit board includes voltage equalising components, and/or temperature sensing components and/or charge control circuitry.

8. A cell unit according to claim 1, wherein each cell is sealed with sealing material, the material protruding at the end of the cell which is connected to the circuit board such that sealing material is arranged both on top of and below the circuit board to protect the electrical connections between the cell and the circuit board.

9. A cell unit according to claim 8, wherein the protruding sealing material is fixed to the circuit board.

10. A cell unit according to claim 9, wherein the sealing material is fixed through one or more apertures in the circuit board.

11. A cell unit according to claim 8, wherein the cells are sealed within a sealing material and any sealing material protruding at an edge of the cell, other than that edge which is to be connected to the circuit board, is folded over onto the surface of the sealed cell, such folded sealed edges then forming a spacer when the cell is folded onto the circuit board.

12. A cell unit according to claims 1, wherein the circuit board is a flexible circuit board.

13. A cell unit according to claim 12, wherein the circuit board can itself fold, and in particular the flexible circuit board has a rectangular shape and can be folded in half.

14. A cell unit according to claim 6, wherein two cells are connected at the same edge of the board.

15. A method of producing a cell unit comprising at least two flat electrochemical cells and a circuit board, wherein the cells are arranged laterally of the circuit board and are electrically connected thereto, the method comprising the step folding the cells onto one or both sides of the circuit board whereby the circuitry on the circuit board is protected.

16. A method according to claim 15, wherein the cells and the circuit board are square or rectangular.

17. A method according to claim 16, wherein cells are provided on two or more edges of the circuit board.

18. A method according to claim 15, wherein each cell is sealed within sealing material, and the material at the end of the cell which is connected to the circuit board protrudes such that sealing material is arranged both on top of and below the circuit board to protect the electrical connections between the cell and the circuit board.

19. A method according to claim 18, wherein the protruding sealing material is fixed to the circuit board.

20. A method according to claim 19, wherein the sealing material is fixed through one or more apertures in the circuit board.

21. A method according to claim 15, wherein the cells are sealed within a sealing material and any sealing material protruding at an edge of the cell, other than that edge which is to be connected to the circuit board, is folded over onto the surface of the sealed cell, such folded sealed edges then forming a spacer when the cell is folded onto the circuit board.

22. A method according to claim 15, wherein the circuit board is a flexible circuit board.

23. A method according to claim 22, wherein the flexible circuit board has a rectangular shape and is folded in half.

24. A method according to claim 17, wherein two cells are connected at the same edge of the board.

* * * * *